United States Patent [19]

Spicer

[11] 4,421,577
[45] Dec. 20, 1983

[54] METHOD FOR MAKING SCHOTTKY BARRIER DIODES WITH ENGINEERED HEIGHTS

[75] Inventor: William E. Spicer, Stanford, Calif.

[73] Assignee: The Board of Trustees of the Leland Stanford, Junior University, Stanford, Calif.

[21] Appl. No.: 205,452

[22] Filed: Nov. 10, 1980

[51] Int. Cl.³ .......................................... H01L 21/26
[52] U.S. Cl. .................................. 148/187; 148/1.5; 427/84; 427/88
[58] Field of Search .................... 427/84, 88; 148/187, 148/1.5

[56] References Cited

U.S. PATENT DOCUMENTS 4,045,248  8/1977  Shannon ............................... 148/1.5
4,211,587  7/1980  Massies ................................ 427/84

Primary Examiner—John D. Smith
Attorney, Agent, or Firm—Flehr, Hohbach, Test, Albritton & Herbert

[57] ABSTRACT

Schottky barrier diodes with engineered barrier heights in III-V semiconductor material are disclosed. By fabricating the diodes using a very clean and defect free surface, the barrier height can be controlled by introducing selected amounts of dopant in the surface prior to evaporation of a contact metal. By selecting a dopant having the same conductivity as the semiconductor material a reliable ohmic contact can be provided.

6 Claims, 2 Drawing Figures

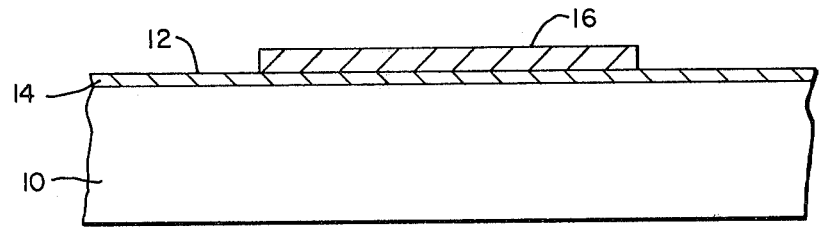
FIG.—1
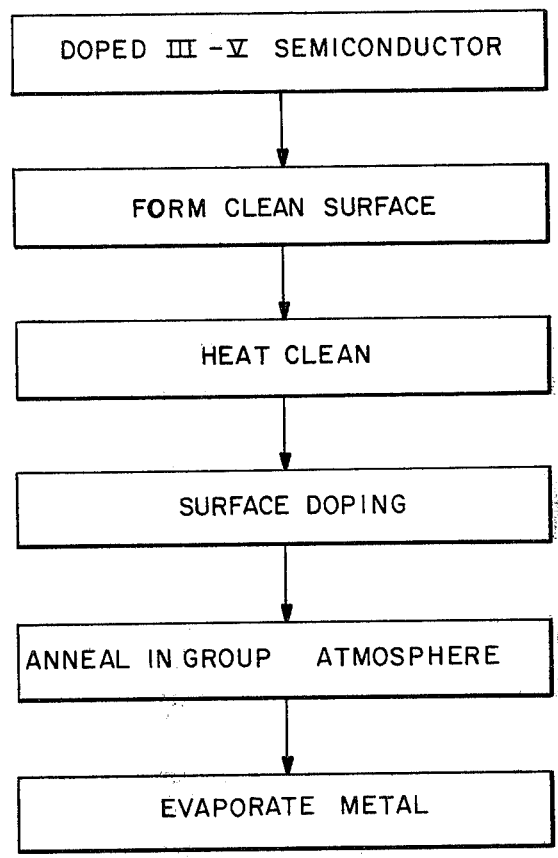
FIG.—2

METHOD FOR MAKING SCHOTTKY BARRIER DIODES WITH ENGINEERED HEIGHTS

The U.S. Government has rights in this invention pursuant to Contract Nos. N-00014-79-C-0072 and N-00014-75-C-0289 of the Office of Naval Research.

This invention relates generally to semiconductor technology, and more particularly the invention relates to methods of fabricating semiconductor devices comprising group III and group V elements and the resulting structures.

Metal contacts to semiconductor devices are widely used in semiconductor electronics to perform rectification functions (e.g. Schottky diodes) and also as ohmic contacts. However, despite the widespread useage of metal contacts, the physics of the metal-semiconductor interface is not fully understood. This is particularly true for semiconductor devices comprising group III and group V elements of the periodic table (e.g. III-V semiconductor material).

The inability to control barrier heights in III-V semiconductor diodes limits applications. The barrier heights roughly fall into a narrow range around two-thirds of the energy gap between the valance and conduction bands of electrons (i.e. the band gap). For example, the barrier heights of gallium arsenide diodes lie between 0.75–0.95 eV compared to the band gap of 1.4 eV. Indium phosphide diodes are an exception in having a barrier height in the range of 0.1–0.4 eV which is far below the band gap of 1.3 eV. However, in all III-V semiconductor diodes the barrier heights have heretofore been relatively fixed in the band gap.

This inability to vary and control barrier height limits the use of III-V Schottky diodes. For example, in solar cell applications a large barrier is desirable, whereas in electronic mixers and in microwave low level detectors a low effective barrier height is needed. Such variations in the barrier heights in III-V Schottky diodes has not been possible heretofore.

Accordingly, an object of the present invention is an improved method of fabricating semiconductor devices having group III elements and group V elements.

Another object of the invention is a method of fabricating III-V Schottky diodes with controlled barrier heights.

Still another object of the invention is an improved III-V Schottky diode.

Yet another object of the invention is an improved method of fabricating ohmic contacts to III-V semiconductor devices.

Briefly, in accordance with the invention a semiconductor device having a metal contact thereon is fabricated by forming a III-V semiconductor body having a dopant of a first conductivity therein and having a clean surface with minimal defects. A second dopant is introduced into the surface, and the surface is exposed to an atmosphere including the group V element of the III-V semiconductor body. A metal contact is then formed on the surface of the semiconductor body with the metal contact including the group III element of the III-V compound.

In fabricating a Schottky diode, the second dopant has a conductivity opposite to that of the semiconductor body, while in fabricating an ohmic contact the second dopant has the same conductivity as the semiconductor body. The provision of engineered barrier heights in a Schottky diode is realized by providing a clean surface with minimal defects.

The barrier heights can then be engineered by the dopant concentration in the surface of the semiconductor body.

The invention and objects and features thereof will be more readily apparent from the following detailed description and appended claims when taken with the drawing, in which:

FIG. 1 is a section view of a semiconductor device in accordance with the invention.

FIG. 2 is a flow diagram illustrating the steps in fabricating a semiconductor device in accordance with the invention.

Referring now to the drawings, FIG. 1 is a section view of a semiconductor device in accordance with the invention. The body 10 comprises a doped III-V semiconductor material having a top surface 12 and a shallow doped region 14 formed in the top surface 12. Formed on the surface 12 in contact with the doped region 14 is a metal contact 16.

In accordance with the invention the contact 16 and semiconductor body 10 may comprise a Schottky diode with engineered barrier heights or the contact may be ohmic. In providing a Schottky diode, the dopant in the layer 14 is of opposite conductivity to the conductivity of the semiconductor body 10 and should provide carriers at the level of the desired barrier height. The metal contact 16 includes the group III element of the semiconductor body 10. In providing an ohmic contact, the dopant in layer 14 is of the same conductivity as the conductivity of the semiconductor body 10. Again, the metal contact 16 includes the group III element of the semiconductor body or another Group III element or other suitable elements such as a combination of Group II and Group IV elements. To get maximum barrier heights in a Schottky diode having N type bulk material, a P type dopant such as from group IIA and group IIB should be selected. In a Schottky diode having P type bulk material an N type dopant such as from group VI should be selected.

In one embodiment, a semiconductor body of indium phosphide with an N type dopant concentration of $10^{15}$–$10^{17}$ atoms per cubic centimeter is utilized. The layer 14 includes $10^{12}$ atoms per square centimeter of berylium which is a P type dopant. Alternatively, zinc can be used as the dopant. Metal contact 16 is selected from the group consisting of silver, gold, and copper with indium metal provided to facilitate the metal contact and formation of a PN junction with the semiconductor body 10. Importantly, the dopant in layer 14 is limited to approximately the top thirty atomic layers of the semiconductor body 10. This can be accomplished by molecular beam epitaxy, for example. The amount of P type dopant introduced into layer 14 determines the barrier height of the resulting diode. While the conventional indium phosphide Schottky diode has a barrier height of 0.1–0.4 eV, a barrier height up to 1.0+eV can be achieved in accordance with the invention depending on the dopant concentration in layer 14. It will be appreciated that the layer 14 must be N type if the semiconductor material is P type.

In another embodiment the semiconductor material 10 is N type gallium arsenide having a dopant concentration on the order of $10^{15}$–$10^{17}$ atoms per cubic centimeter. The layer 14 is a P type dopant such as berylium or zinc. The metal contact 14 is preferably selected from indium, aluminum, and silver with the addition of gallium. However, other suitable metals can be employed. Whereas the conventional Schottky diode using N type gallium arsenide has a barrier height of 0.7–0.9 eV, a barrier height of 1.2+eV can be achieved in accordance with the invention. Again, it will be appreciated if the semiconductor material is P type, then the layer 14 must include N type dopant.

Improved Ohmic contacts can be provided in accordance with the invention, also. In providing an ohmic contact the layer 14 must include dopant of the same conductivity type as the semiconductor body 10 with the dopant concentration in the layer 14 be on the order of $10^-$ atoms per square centimeter.

The method of fabricating the semiconductor devices is an important aspect of the invention. FIG. 2 is a flow diagram of the process steps in accordance with the invention. The surface of the semiconductor body on which the metal contact is formed must be clean with minimal crystalline defects. The preferred method of providing a clean, defect free surface is by cleaving a semiconductor body in an ultra high vacuum environment. Alternatively, molecular beam epitaxy and laser annealing can be utilized in minimizing the surface defects. The surface is heat cleaned to remove any oxides. Heat cleaning of the semiconductor surface can be accomplished by heating the semiconductor body at a temperature of 400°–600° C. to evaporate any oxides. The heating must be accomplished in an atmosphere having a partial pressure of the most volatile element of the III-V material to suppress the loss of that element. For example, gallium arsenide is heated in an atmosphere having a partial pressure of arsenic as arsenic is more volatile than gallium.

Dopant is then introduced into the layer 14 by molecular beam epitaxy growth, or ion implantation, followed by another exposure of the semiconductor body to an atmosphere having a partial pressure of the group V element, thereby terminating the surface of the semiconductor body with the group V element. The exposure to the group V element can be at a raised temperature for thermal or laser annealing of the surface, thus repairing excess defects prior to the metallization.

The semiconductor body is then placed in an evaporation chamber for depositing the metal contact on the surface with minimal defects. As above indicated, the evaporated metal which is deposited on the surface includes the group III element of the semiconductor material. The metal is deposited slowly from small shielded evaporation sources to avoid heating of the surface and the native metal and to minimize intermixing of the metal and semiconductor material.

Finally, the device including the metal contact is thermally annealed at a temperature up to 700° C. The temperature should be ramped rapidly to the annealing temperature with the semiconductor body maintained at the annealing temperature for approximately 4–6 minutes at 700° C. or at increasingly longer periods of time at reduced annealing temperatures.

By fabricating semiconductor devices in accordance with the invention, improved Schottky diodes are provided with high barriers for use in solar cells and field effect transistors for example with lower barriers for use in microwave applications, for example. Further, better control of ohmic contacts is provided in Gunn oscillators, for example, using the present invention.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a semiconductor device including group III elements and group V elements of the periodic table and having a metal contact thereon comprising the steps of:
    (1) forming a semiconductor body including a first dopant of a first conductivity type and having a clean surface with minimal defects,
    (2) introducing a second dopant into said surface,
    (3) exposing said surface to an atmosphere including the group V element of the semiconductor body, and
    (4) providing a metal contact on said surface.

2. The method as defined in claim 1 wherein said metal contact includes a Group III element.

3. The method of fabricating a III-V semiconductor Schottky diode comprising the steps of:
    (1) providing a III-V semiconductor body including a dopant of a first conductivity type and having a clean surface with minimal defects,
    (2) introducing a second dopant of opposite conductivity type into said surface,
    (3) exposing said surface to an atmosphere including the group V element of the III-V semiconductor body, and
    (4) providing a metal contact on said surface.

4. The method as defined by claim 3 wherein said metal contact includes a Group III element.

5. The method of fabricating an ohmic contact on a III-V semiconductor device comprising the steps of
    (1) providing a III-V semiconductor body including a dopant of a first conductivity type and having a clean surface with minimal defects,
    (2) introducing a second dopant of the same conductivity type into said surface,
    exposing said surface to an atmosphere including the group V element of said III-V semiconductor body, and
    providing a metal contact on said surface.

6. The method as defined by claim 5 wherein said metal contact includes a Group III element.

* * * * *